United States Patent
Mahajan et al.

(10) Patent No.: US 10,496,925 B2
(45) Date of Patent: Dec. 3, 2019

(54) SYSTEM AND METHOD FOR VISUALIZING DATA ANALYTICS MODELS

(71) Applicant: Impetus Technologies, Inc., Los Gatos, CA (US)

(72) Inventors: Aashu Mahajan, Los Gatos, CA (US); Amarjeet Singh Khalsa, Indore (IN); Aman Solanki, Indore (IN); Abhishek Singh Gour, Indore (IN); Saurabh Dutta, Indore (IN); Nitin Agrawal, Indore (IN)

(73) Assignee: IMPETUS TECHNOLOGIES, INC., Los Gatos, CA (US)

( * ) Notice: Subject to any disclaimer, the term of this patent is extended or adjusted under 35 U.S.C. 154(b) by 97 days.

(21) Appl. No.: 15/348,508

(22) Filed: Nov. 10, 2016

(65) Prior Publication Data

US 2017/0132817 A1 May 11, 2017

Related U.S. Application Data

(60) Provisional application No. 62/253,246, filed on Nov. 10, 2015.

(51) Int. Cl.
*G06N 99/00* (2019.01)
*G06F 17/30* (2006.01)
(Continued)

(52) U.S. Cl.
CPC ........... *G06N 3/105* (2013.01); *G06F 16/248* (2019.01); *G06F 17/50* (2013.01)

(58) Field of Classification Search
CPC ....... G06F 8/10–78; G06F 9/44–45558; G06F 16/2465; G06F 19/00; G06N 5/00–08; G06N 3/105; G06N 20/00; G06Q 50/22
See application file for complete search history.

(56) References Cited

U.S. PATENT DOCUMENTS 7,167,846 B2    1/2007    Provost et al.
7,305,656 B2 * 12/2007    Fish .......................... G06F 8/20
                                                                                               717/105

(Continued)

OTHER PUBLICATIONS

Sottara et al., Enhancing a production rule engine with predictive models using pmml, 9 pages (Year: 2011).*

(Continued)

*Primary Examiner* — Thuy Dao
(74) *Attorney, Agent, or Firm* — Hayes Soloway P.C.

(57) ABSTRACT

A system and method for visualizing and updating a data analytics model using Graphical User Interface (GUI) is disclosed. The system is configured to receive an input file, from a user, storing a data analytics model. Based upon the input file, the system identifies the standard template, from a set of template, corresponding to a data analytics module of the input file. Further, the system is configured to display a graphical representation corresponding to the data analytics model based upon the standard template of the data analytics model, wherein the graphical representation comprises a set of elements corresponding to the data analytics model. Further, the system enables editing one or more elements from the set of elements of the graphical representation. Upon modification of the elements of graphical representation, the system enables updating the input file, thereby update the data analytics model using the GUI.

13 Claims, 4 Drawing Sheets

(51) Int. Cl.
*G06F 9/44* (2018.01)
*G06F 15/18* (2006.01)
*G06N 5/04* (2006.01)
*G06N 3/10* (2006.01)
*G06F 16/248* (2019.01)
*G06F 17/50* (2006.01)

(56) References Cited

U.S. PATENT DOCUMENTS

| | | | |
|---|---|---|---|
| 8,037,000 B2 | 10/2011 | Delmonico et al. | |
| 8,055,595 B1* | 11/2011 | Birch | G06N 20/00 706/12 |
| 8,209,274 B1* | 6/2012 | Lin | G06N 3/08 706/21 |
| 8,250,009 B1* | 8/2012 | Breckenridge | G06N 99/005 706/12 |
| 8,364,613 B1* | 1/2013 | Lin | G06N 7/005 706/12 |
| 8,370,280 B1* | 2/2013 | Lin | G06N 99/005 706/12 |
| 8,522,196 B1* | 8/2013 | Kim | G06F 11/3664 717/100 |
| 9,141,403 B2* | 9/2015 | Zhang | G06F 3/0482 |
| 9,645,719 B2* | 5/2017 | Zhang | G06F 3/0482 |
| 9,690,575 B2* | 6/2017 | Prismon | G06F 8/71 |
| 10,055,691 B2* | 8/2018 | Brand | G06N 5/02 |
| 10,310,846 B2* | 6/2019 | Pallath | G06F 8/70 |
| 10,438,132 B2* | 10/2019 | Duggan | G06F 16/22 |
| 2003/0154191 A1* | 8/2003 | Fish | G06F 8/34 |
| 2003/0222906 A1* | 12/2003 | Fish | G06F 8/20 715/744 |
| 2004/0068476 A1* | 4/2004 | Provost | G06N 5/003 706/45 |
| 2009/0234791 A1* | 9/2009 | Delmonico | G06F 17/2288 706/50 |
| 2012/0210256 A1* | 8/2012 | Zhang | G06F 3/0482 715/763 |
| 2015/0134401 A1 | 5/2015 | Heuer | |
| 2015/0205602 A1 | 7/2015 | Prismon et al. | |
| 2015/0293755 A1* | 10/2015 | Robins | G06F 9/44526 717/104 |
| 2015/0363079 A1* | 12/2015 | Zhang | G06F 3/0482 715/762 |
| 2016/0004979 A1* | 1/2016 | Getchius | G06F 19/328 706/12 |
| 2016/0019258 A1* | 1/2016 | Clark | G06F 16/2423 707/766 |
| 2017/0205982 A1* | 7/2017 | Zhang | G06F 3/0482 |

OTHER PUBLICATIONS

Gunnemann et al., An extension of the PMML standard to subspace clustering models, 6 pages (Year: 2011).*
R. Grossmana, S. Baileya, A. Ramua, B. Malhia, P. Hallstromb, I. Pulleynb, Xiao Qinb, "The management and mining of multiple predictive models using the predictive modeling markup language", ACM SIGKDD Explorations Newsletter , Jun. 25, 1999, pp. 589-595, vol. 41, Issue 9.
Michael R. Berthold, Nicolas Cebron, Fabian Dill, Thomas R. Gabrie, Tobias Kötter, Thorsten Meinl, Peter Ohl, Kilian Thiel, Bernd Wiswedel, "Knime—the Konstanz information miner: version 2.0 and beyond", Jun. 1, 2009, pp. 26-31, vol. 11 Issue 1.
Dietrich Wettschereck and Stefan Muller, "Exchanging Data Mining Models with the Predictive Modelling Markup Language", 2001.

* cited by examiner

Input PMML tree Model (XML)   Output PMML tree Model (Visualized)

Input PMML Neural
Network Model (XML)

Output PMML Neural
Network Model (Visualized)

SYSTEM AND METHOD FOR VISUALIZING DATA ANALYTICS MODELS

PRIORITY INFORMATION

The patent application takes priority from a US provisional application titled "System and Method for Visualizing Data Analytics Models" having application No. 62/253,246 and filed on Nov. 10, 2015, the entire disclosure of which is incorporated herein by reference.

TECHNICAL FIELD

The present disclosure described herein, in general, relates to data analytics, and more particularly to a system and method for visualizing and updating data analytics models.

BACKGROUND

Data analytics helps different enterprises in deriving valuable insights based upon analysis of real time incoming data. There are various data analytics tools available in the art that are capable of processing input data to derive valuable insights or outcomes based on the analysis of input data. In one example, a data analytics tool may be employed in order to predict a suitable product for a consumer based upon past purchase behavior of other consumers having similar demographic profile as that of the consumer. Similarly, the data analytics tool may be employed in order to predict number of bookings expected on Railway/Airway reservation portals during peak traffic seasons. Furthermore, in another example, the data analytics tool may also be employed for analyzing transactions in capital market in order to recommend a stock suitable for investment by an investor.

Typically, the data analytics tool functions based on data analytics models (also referred hereinafter as Models) including, but not limited to, a Logistic Regression Model, a Regression Model, a Cluster Model, a Tree Model, a Neural Network Model and the like. The data analytics models are generated based on programming languages such as R, Knime and the like. It is to be noted that the programming languages, of different formats/conventions, are complex and therefore difficult to comprehend. Usually, a software developer/programmer may wish to analyze/comprehend the model in order to check whether any of the features may be updated/added/deleted. Further, the software developer/programmer may wish to update the weights associated with one or more features of the model. Hence, the comprehension/analytics of each of the models is desirable.

Conventionally, the data analytics models designed using different programming languages are converted into a PMML (Predictive Model Markup Language) for the purpose of standardization and simplicity of understanding. By using PMML, the data analytical models are translated into a one common format (i.e. XML format). Therefore, all the aforementioned data analytics models are represented in the common format (XML) based on the PMML specifications. The data analytics models represented in PMML format are also called as PMML models. However, there still exists technical challenge in visualizing and updating the XML format of the PMML models. This is because the XML file of the PMML models captures the model information in form of tags and text which is difficult to comprehend quickly considering the complexity of the logic of each of the aforementioned models.

SUMMARY

Before the present systems and methods, are described, it is to be understood that this application is not limited to the particular systems, and methodologies described, as there can be multiple possible embodiments which are not expressly illustrated in the present disclosure. It is also to be understood that the terminology used in the description is for the purpose of describing the particular versions or embodiments only, and is not intended to limit the scope of the present application. This summary is provided to introduce concepts related to systems and methods for visualizing and updating a data analytical model using Graphical User Interface (GUI) and the concepts are further described below in the detailed description. This summary is not intended to identify essential features of the claimed subject matter nor is it intended for use in determining or limiting the scope of the claimed subject matter.

In one implementation, a method for visualizing and updating a data analytics model using a Graphical User Interface (GUI) is disclosed. Initially an input file is received from a user device of a user. The input file may correspond to a data analytics model. The input file may be a Predictive Model Markup Language (PMML) file corresponding to the data analytics model to be represented over the GUI. After receiving the input file, a standard template may be identified from a set of standard templates corresponding to the data analytics model. Further a graphical representation corresponding to the data analytics model may be generated and displayed over the GUI. In one embodiment, the graphical representation may be generated by analyzing the input file based upon the standard template. The graphical representation may comprise a set of elements corresponding to the data analytics model. After displaying the graphical representation corresponding to the data analytics model, one or more elements from the set of elements of the graphical representation may be modified based upon one or more inputs received from the user. Subsequent to the modification of the one or more elements from the set of elements of the graphical representation, the input file may be updated based on the modification of the one or more elements thereby updating the data analytics model using the GUI. In one aspect, the aforementioned method for visualizing and updating the data analytics model using the GUI may be performed by a processor using programmed instructions stored in a memory.

In another implementation, a system for visualizing and updating a data analytical model using a Graphical User Interface (GUI) is disclosed. The system may comprise a processor and a memory coupled to the processor. The processor may execute a plurality of modules present in the memory. The plurality of modules may comprise a data capturing module, a template identification module, a visualization module, an editing module, and an updating module. The data capturing module may receive an input file from a user device of a user, wherein the input file corresponds to a data analytics model. The input file may be a Predictive Model Markup Language (PMML) file corresponding to the data analytics model to be represented over the GUI. Further, the template identification module may identify a standard template, from a set of standard templates, corresponding to the data analytics model. Once the standard template is identified, the visualization module may generate and display a graphical representation corresponding to the data analytics model over the GUI. The graphical representation may be generated, by the visualization module, by analyzing the input file based upon the standard template. In one aspect, the graphical representation may comprise a set of elements corresponding to the data analytics model. After displaying the graphical representation corresponding to the data analytics model, the editing module may modify one or more elements from the set of elements of the graphical representation based upon one or more inputs received from the user. Subsequent to the modification of the one or more elements from the set of elements of the graphical representation, the updating module may update the input file based on the modification of the one or more elements thereby updating the data analytics model using the GUI.

In yet another implementation, non-transitory computer readable medium embodying a program executable in a computing device for visualizing and updating a data analytics model using Graphical User Interface (GUI) is disclosed. The program may comprise a program code for receiving an input file from a user device of a user, wherein the input file corresponds to a data analytics model. The input file may be a Predictive Model Markup Language (PMML) file corresponding to the data analytics model to be represented over the GUI. The program may further comprise a program code for identifying a standard template, from a set of standard templates, corresponding to the data analytics model. The program may further comprise a program code for generating and displaying a graphical representation corresponding to the data analytics model over the GUI. The graphical representation may be generated by analyzing the input file based upon the standard template, wherein the graphical representation comprises a set of elements corresponding to the data analytics model. The program may further comprise a program code for modifying one or more elements from the set of elements of the graphical representation, based upon one or more inputs received from the user. The program may further comprise a program code for updating the input file based upon the modifications of the one or more elements of the graphical representation based on the modification of the one or more elements thereby updating the data analytics model using the GUI.

BRIEF DESCRIPTION OF THE DRAWINGS

The foregoing detailed description of embodiments is better understood when read in conjunction with the appended drawings. For the purpose of illustrating the disclosure, example constructions of the disclosure is shown in the present document; however, the disclosure is not limited to the specific methods and apparatus disclosed in the document and the drawings.

The detailed description is given with reference to the accompanying figures. In the figures, the left-most digit(s) of a reference number identifies the figure in which the reference number first appears. The same numbers are used throughout the drawings to refer like features and components.

DETAILED DESCRIPTION

Figure 1:
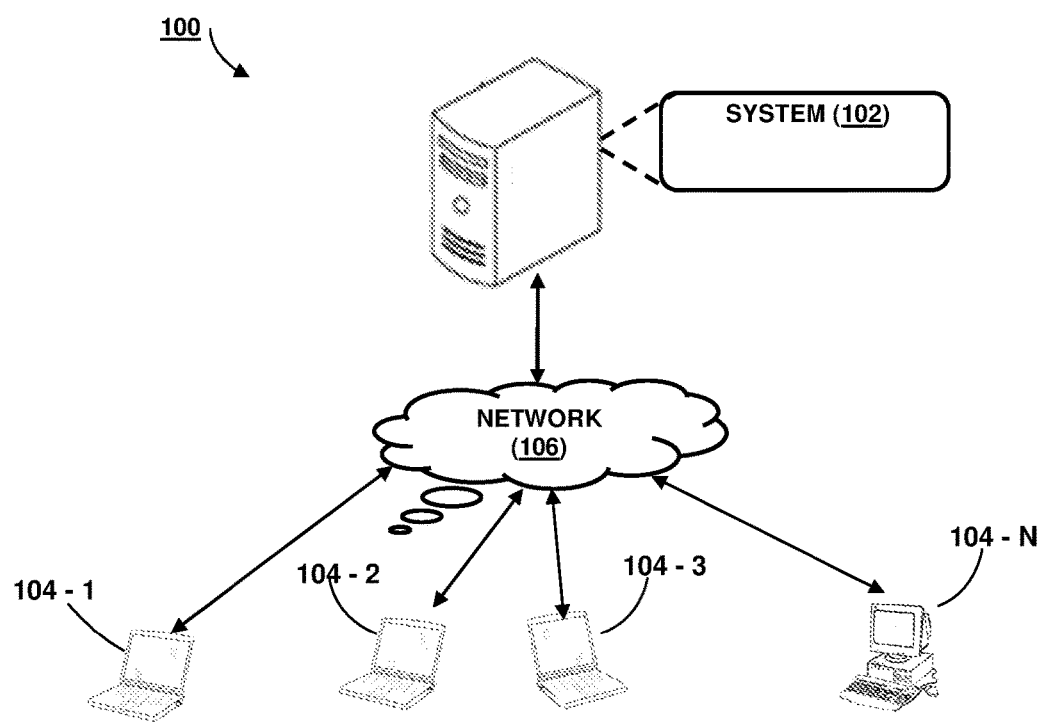
FIG. 1 illustrates a network implementation of a system for visualizing and updating a data analytics model using Graphical User Interface (GUI), in accordance with an embodiment of the present subject matter.

Some embodiments of this disclosure, illustrating all its features, will now be discussed in detail. The words "receiving," "identifying," "displaying," "modifying," and "updating," and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise. Although any systems and methods similar or equivalent to those described herein can be used in the practice or testing of embodiments of the present disclosure, the exemplary, systems and methods are now described. The disclosed embodiments are merely exemplary of the disclosure, which may be embodied in various forms.

Various modifications to the embodiment will be readily apparent to those skilled in the art and the generic principles herein may be applied to other embodiments. However, one of ordinary skill in the art will readily recognize that the present disclosure is not intended to be limited to the embodiments illustrated, but is to be accorded the widest scope consistent with the principles and features described herein.

The present disclosure illustrates a system and a method for visualizing and updating a data analytics model using Graphical User Interface (GUI). In one embodiment, the system may create a standard template for each type of data analytics models. In an example, the data analytics models may include, but not limited to, a Logistic Regression Model, a Regression Model, a Cluster Model, a Tree Model, a Neural Network Model and the like. In an embodiment, upon receipt of an input file, the system of the present disclosure may identify a standard template, from a set of standard templates, corresponding to the data analytics model. Further, the system may generate and display a graphical representation corresponding to the data analytics model. The graphical representation may be generated by analyzing the input file based upon the standard template. In one aspect, the graphical representation may comprise a set of elements corresponding to the data analytics model.

Once the input file is displayed on the GUI, a user of the system may interact with the GUI in order to visualize each of the data analytics models. Specifically, the user may visualize various features (interchangeably used as "elements") of a model, a weight of each feature of the model, how a feature interacts with other features of the model, how the data flows in the model and the like. Similarly, the user may visualize the features, the weights of the features, interaction amongst the features and data flow for any of the aforementioned models. In an embodiment, the system of the present disclosure may further enable the user to interact with the model being visualized and modify the features of the model and weights of the features. Thereafter, once the features and the weights are modified, the user may update the input file with the updated features and/or weights.

Referring now to FIG. 1, a network implementation 100 of a system 102 for visualizing and updating a data analytics model using Graphical User Interface (GUI) is disclosed. In an example, the data analytics models may include, but not limited to, a Logistic Regression Model, a Regression Model, a Cluster Model, a Tree Model, a Neural Network Model and the like. In one aspect, the system 102 is configured to generate a set of standard templates based upon a set of predefined rules corresponding to each of the data analytics models. The set of standard templates is maintained in a database associated with the system 102. Further, in order to visualize and update the data analytics model using GUI, initially, the system 102 may receive an input file from a user device 104, wherein the input file may correspond to a data analytics model. The input file may be a Predictive Model Markup Language (PMML) file corresponding to the data analytics model to be represented over the GUI. After receiving the input file, the system 102 may identify a standard template, from the set of standard templates, corresponding to the data analytics model. Subsequent to the identification of the standard template, the system 102 may display a graphical representation corresponding to the data analytics model. The system 102 may generate a graphical representation by analyzing the input file based upon the standard template, wherein the graphical representation may comprise a set of elements corresponding to the data analytics model. The set of elements of the graphical representation may represent at least one of a weight of each element of the data analytics model, an interaction of one element with the other elements, a data flow in the data analytics model and the like.

In one aspect, the system 102 may enable the user to edit the graphical representation corresponding to the data analytics model. Further, the system 102 may modify one or more elements from the set of elements of the graphical representation based upon one or more inputs received from the user. Subsequent to the modification of the one or more elements from the set of elements of the graphical representation, the system 102 may update the input file corresponding to the data analytics model.

Although the present disclosure is explained considering that the system 102 is implemented on a server, it may be understood that the system 102 may be implemented in a variety of computing systems, such as a laptop computer, a desktop computer, a notebook, a workstation, a mainframe computer, a server, a network server, a cloud-based computing environment. It will be understood that the system 102 may be accessed by multiple users through one or more user devices 104-1, 104-2 . . . 104-N, collectively referred to as user 104 or stakeholders, hereinafter, or applications residing on the user devices 104. In one implementation, the system 102 may comprise the cloud-based computing environment in which a user may operate individual computing systems configured to execute remotely located applications. Examples of the user devices 104 may include, but are not limited to, a portable computer, a personal digital assistant, a handheld device, and a workstation. The user devices 104 are communicatively coupled to the system 102 through a network 106.

In one implementation, the network 106 may be a wireless network, a wired network or a combination thereof. The network 106 can be implemented as one of the different types of networks, such as intranet, local area network (LAN), wide area network (WAN), the internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further the network 106 may include a variety of network devices, including routers, bridges, servers, computing devices, storage devices, and the like.

Figure 2:
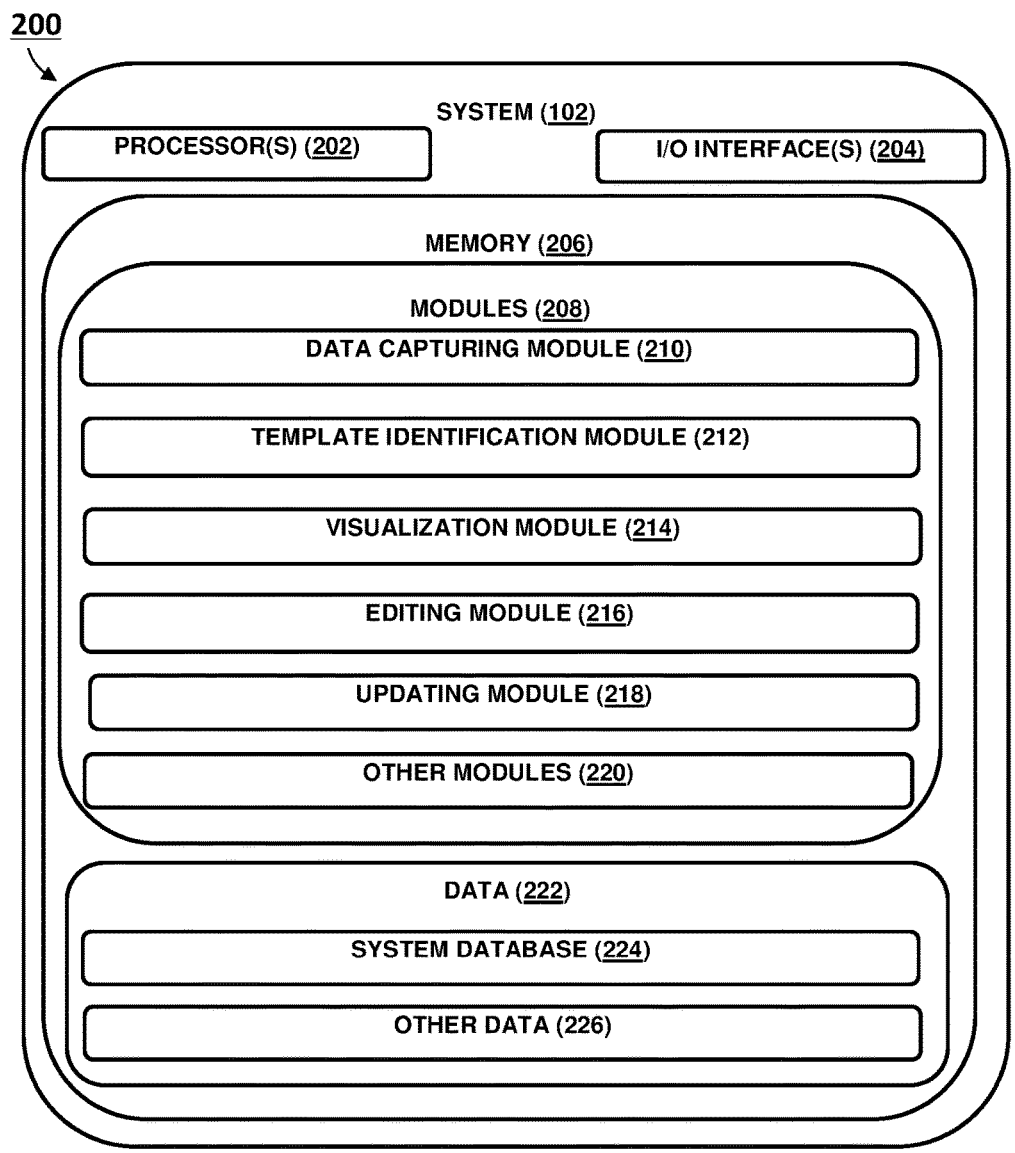
FIG. 2 illustrates the system, in accordance with an embodiment of the present subject matter.

Referring now to FIG. 2, the system 102 is illustrated in accordance with an embodiment of the present subject matter. In one embodiment, the system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 is configured to fetch and execute computer-readable instructions stored in the memory 206.

The I/O interface 204 may include a variety of software and hardware interfaces, for example, a web interface, a graphical user interface, and the like. The I/O interface 204 may allow the system 102 to interact with the user directly or through the client devices 104. Further, the I/O interface 204 may enable the system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium or computer program product known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 222.

The modules 208 include routines, programs, objects, components, data structures, etc., which perform particular tasks or implement particular abstract data types. In one implementation, the modules 208 may include a data capturing module 210, a template identification module 212, a visualization module 214, an editing module 216, an updating module 218, and other modules 220. The other modules 220 may include programs or coded instructions that supplement applications and functions of the system 102. The modules 208 described herein may be implemented as software modules that may be executed in the cloud-based computing environment of the system 102.

The data 222, amongst other things, serves as a repository for storing data processed, received, and generated by one or more of the modules 208. The data 222 may also include a system database 224 and other data 226. The other data 226 may include data generated as a result of the execution of one or more modules in the other modules 220.

In order to visualize and update a data analytics model using the GUI, at first, a user may use the client device 104 to access the system 102 via the I/O interface 204. The user may register him to the system 102 using the I/O interface 204 in order to use the system 102. The system 102 may employ the data capturing module 210, the template identification module 212, the visualization module 214, the editing module 216, the updating module 218, and the other modules 220 for visualizing and updating of a data analytics model using Graphical User Interface (GUI).

In one embodiment, the data capturing module 210 is configured to receive input file from a user, wherein the input file corresponds to the data analytics model to be visualized over the GUI. The input file may be a Predictive Model Markup Language (PMML) file corresponding to the data analytics model. The input file may also be generated as an output of a business analytics tool, wherein the business analytics tool may be configured to perform Big Data analysis. Further, the data capturing module 210 is configured to generate a set of standard templates. In one embodiment, the each standard template from set of standard templates may be built based upon a set of predefined rules corresponding to each type data analytics model. In one embodiment, depending on the type of the data analytics model, the data capturing module 210 may identify various components and rules required to build the standard template. In one embodiment, the components include various nodes of the data analytics model, left/right child node of a parent node, an edge connecting the parent node to the child node, weight on each node of the data analytics model and alike. It is to be noted that for each of the data analytics model, a unique standard template is created and maintained by the data capturing module 210.

Once the set of templates is generated, in the next step, the template identification module 212 may identify a standard template, from a set of standard templates, corresponding to the data analytics model. In one embodiment, the input file provided by the user may be a PMML file. Based upon the contents of the PMML file, the template identification module 210 may identify the standard template from the set of standard templates stored in the system database 224 the system 102 for each of the data analytics module. The standard template herein may refer to a data structure required for fetching the information as per a test user interface design of each of the data analytics models. In one embodiment, the standard template may act as a property PMML file that facilitates in capturing of the XML information from the input file.

In one embodiment, the visualization module 214 may display a graphical representation corresponding to the data analytics model. The graphical representation may be generated by analyzing the PMML file based upon the standard template. In one aspect, the graphical representation may comprise a set of elements corresponding to the data analytics model. In one embodiment, depending on the data analytics model, the visualization module 214 may identify various components required and populate the template. In one embodiment, the components include various nodes of the data analytics model, left/right child node of a parent node, an edge connecting the parent node to the child node, weight on each node of the data analytics model etc. Specifically, the visualization module 214 may interpret and translate a PMML file, corresponding to the data analytics model, into the corresponding standard template specific structure thereby populating the standard template with the data analytical model and PMML file specific data.

In one embodiment, the visualization module 214 may translate the PMML file into JavaScript Object Notation (JSON) format. In one aspect, the visualization module 214 may translate entire information captured in the PMML file into JSON format. In another embodiment, only part of the entire information required to be visualized may be filtered out and translated into JSON format. The visualization module 214 may then map the information captured in the JSON format with the GUI in order to render the data analytics model on the GUI for the visualization of the data analytics model. The visualization module 214 may render the graphical representation over at least one of a monitor, a display screen, mobile display and others.

In one embodiment, the editing module 216 may modify one or more elements from the set of elements of the graphical representation based upon one or more inputs received from a user. In one aspect, the editing module 216 may enable the user to modify the weights associated with the elements, data flow between the nodes of the data analytical models, the features of the data analytical models and others. In one aspect, the editing module 216 may provide a palette of predefined functional blocks including, but not limited to, ready to use nodes, code blocks, arrows, data flow instruments and others. In another aspect, the editing module 216 may comprise functions including, but not limited to, drag and drop operation, deletion, changing parameters, changing values of the elements, and others, in order to modify the graphical representation of the data analytical module. In one example the editing module 216 may edit various nodes of the data analytical model, left/right child node of a parent node, an edge connecting the parent node to the child node, weight on each node of the data analytical model.

In one embodiment, the updating module 218 may update the input file based on the modification of one or more elements from the set of elements of the graphical representation. In one aspect, the updating module 218 may re-generate the data analytical module based on the modification of one or more elements of the graphical representation of the data analytical models. In an embodiment, when the user 104 updates the features and/or weights associated with the data analytical model, the updating module 218 may be configured to map the standard template of the data analytical model back to the PMML file to generate a modified PMML file. In another aspect, the updating module 218 may export the modified PMML file via communication medium including, but not limited to, an email, cloud storage, and others. In one aspect, the updating module 218 may store the modified PMML input file, in the memory of the system 102.

Figure 3:
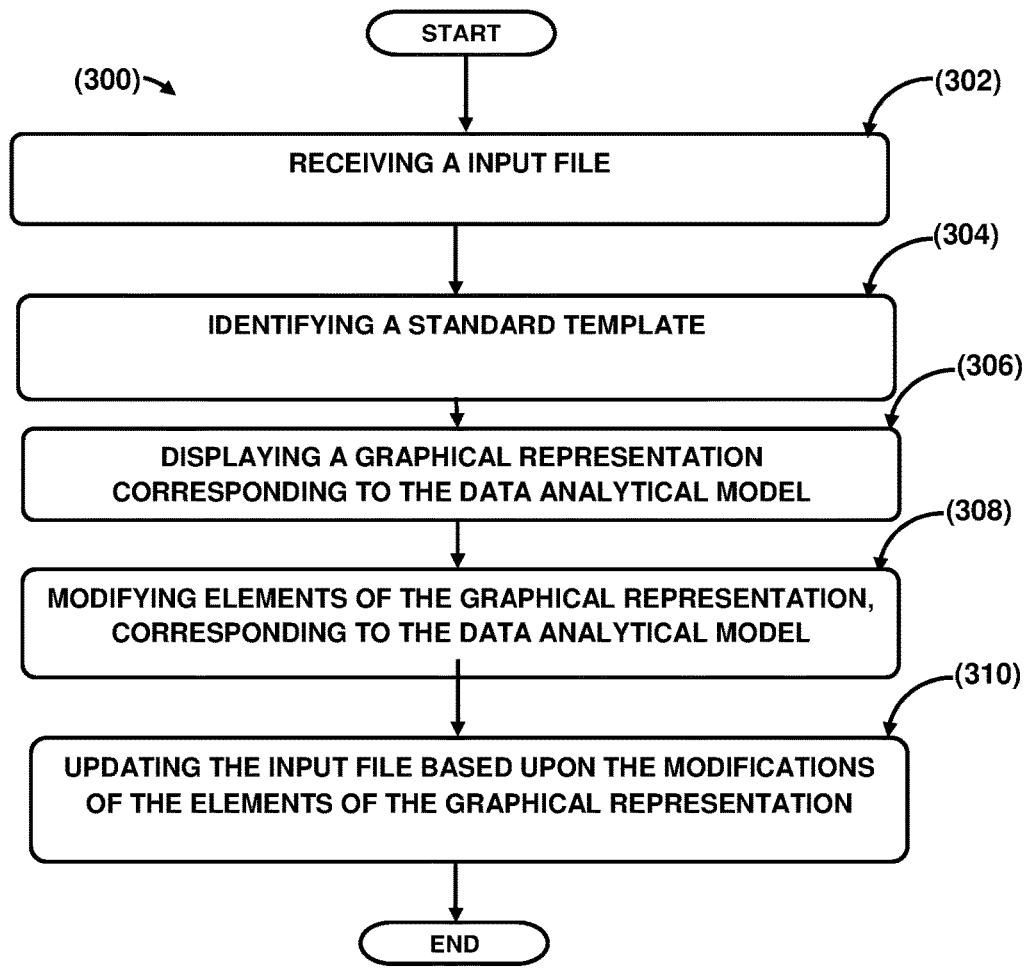
FIG. 3 illustrates a flow graph corresponding to the method for visualizing and updating a data analytics model using Graphical User Interface (GUI), in accordance with an embodiment of the present subject matter.

Referring now to FIG. 3, a method 300 for visualizing and updating a data analytics model using Graphical User Interface (GUI) is disclosed, in accordance with an embodiment of the present subject matter. The method 300 may be described in the general context of computer executable instructions. Generally, computer executable instructions can include routines, programs, objects, components, data structures, procedures, modules, functions, and the like, that perform particular functions or implement particular abstract data types. The method 300 may also be practiced in a distributed computing environment where functions are performed by remote processing devices that are linked through a communications network. In a distributed computing environment, computer executable instructions may be located in both local and remote computer storage media, including memory storage devices.

The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method 300 can be implemented in any suitable hardware, software, firmware, or combination thereof. However, for ease of explanation, in the embodiments described below, the method 300 may be considered to be implemented in the above described system 102.

At block 302, the data capturing module 210 is configured to receive input file from a user, wherein the input file corresponds to the data analytics model to be visualized over the GUI. The input file may be a Predictive Model Markup Language (PMML) file corresponding to the data analytics model. The input file may also be generated as an output of a business analytics tool, wherein the business analytics tool may be configured to perform Big Data analysis. Further, the data capturing module 210 is configured to generate a set of standard templates. In one embodiment, the each standard template from set of standard templates may be built based upon a set of predefined rules corresponding to each type data analytics model. In one embodiment, depending on the type of the data analytics model, the data capturing module 210 may identify various components and rules required to build the standard template. In one embodiment, the components include various nodes of the data analytics model, left/right child node of a parent node, an edge connecting the parent node to the child node, weight on each node of the tree model and alike. It is to be noted that for each of the data analytics model, a unique standard template is created and maintained by the data capturing module 210.

At block 304, once the set of templates is generated, in the next step, the template identification module 212 may identify a standard template, from a set of standard templates, corresponding to the data analytics model. In one embodiment, the input file provided by the user may be a PMML file. Based upon the contents of the PMML file, the template identification module 210 may identify the standard template from the set of standard templates stored in the system database 224 the system 102 for each of the data analytics module. The standard template herein may refer to a data structure required for fetching the information as per a test user interface design of each of the data analytics models. In one embodiment, the standard template may act as a property PMML file that facilitates in capturing of the XML information from the input file.

At block 306, the visualization module 214 may display a graphical representation corresponding to the data analytics model. The graphical representation may be generated by analyzing the PMML file based upon the standard template. In one aspect, the graphical representation may comprise a set of elements corresponding to the data analytics model. In one embodiment, depending on the data analytics model, the visualization module 214 may identify various components required and populate the template. In one embodiment, the components include various nodes of the data analytics model, left/right child node of a parent node, an edge connecting the parent node to the child node, weight on each node of the data analytics model etc. Specifically, the visualization module 214 may interpret and translate a PMML file, corresponding to the data analytics model, into the corresponding standard template specific structure thereby populating the standard template with the data analytical model and PMML file specific data.

In one embodiment, the visualization module 214 may translate the PMML file into JavaScript Object Notation (JSON) format. In one aspect, the visualization module 214 may translate entire information captured in the PMML file into JSON format. In another embodiment, only part of the entire information required to be visualized may be filtered out and translated into JSON format. The visualization module 214 may then map the information captured in the JSON format with the GUI in order to render the data analytics model on the GUI for the visualization of the data analytics model. The visualization module 214 may render the graphical representation over at least one of a monitor, a display screen, mobile display and others.

At block 308, the editing module 216 may modify one or more elements from the set of elements of the graphical representation based upon one or more inputs received from a user. In one aspect, the editing module 216 may enable the user to modify the weights associated with the elements, data flow between the nodes of the data analytical models, the features of the data analytical models and others. In one aspect, the editing module 216 may provide a palette of predefined functional blocks including, but not limited to, ready to use nodes, code blocks, arrows, data flow instruments and others. In another aspect, the editing module 216 may comprise functions including, but not limited to, drag and drop operation, deletion, changing parameters, changing values of the elements, and others, in order to modify the graphical representation of the data analytical module. In one example the editing module 216 may edit various nodes of the data analytical model, left/right child node of a parent node, an edge connecting the parent node to the child node, weight on each node of the data analytical model.

At block 310, the updating module 218 may update the input file based on the modification of one or more elements from the set of elements of the graphical representation. In one aspect, the updating module 218 may re-generate the data analytical module based on the modification of one or more elements of the graphical representation of the data analytical models. In an embodiment, when the user 104 updates the features and/or weights associated with the data analytical model, the updating module 218 may be configured to map the standard template of the data analytical model back to the PMML file to generate a modified PMML file. In another aspect, the updating module 218 may export the modified PMML file via communication medium including, but not limited to, an email, cloud storage, and others. In one aspect, the updating module 218 may store the modified PMML input file, in the memory of the system 102.

Figure 4A:
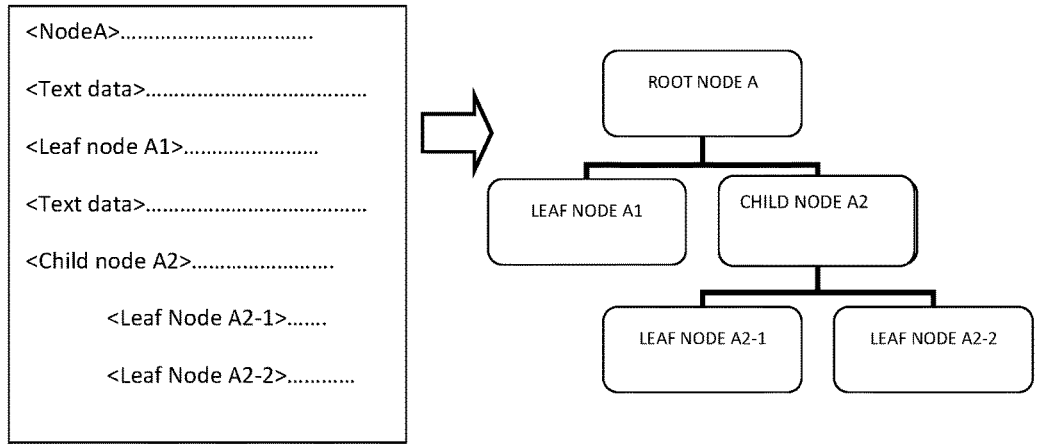
FIGS. 4*a* and 4*b* illustrate examples, in accordance with an embodiment of the present subject matter.

FIG. 4a illustrates examples of visualizing a tree model. Initially, the system 102 may built a set of standard template based upon various components and rules corresponding to the tree model. The components include various nodes of the tree model, left/right child node of a parent node, an edge connecting the parent node to the child node, weight on each node of the tree model and alike. Further the system 102 may receive an input file from the user, wherein the input file corresponds to the tree model to be visualized over a Graphical User Interface (GUI). The input file may be a Predictive Model Markup Language (PMML) file corresponding to the tree model. The system 102 may further identify the standard template corresponding to the tree model. Further, the system 102 may visualize a graphical representation of the tree model and set of elements corresponding to the tree model. The system 102 may enable the user to modify the graphical representation of the tree model over the GUI. In one aspect, the system 102 may enable the user to modify the weights associated with the elements, data flow between the nodes of the data analytical models, the features of the tree models and others. In one example, the system 102 may edit various nodes of the tree model, left/right child node of a parent node, an edge connecting the parent node to the child node, weight on each node of the tree model. Further, the system 102 may update the input file based on the modification of one or more elements from the set of elements of the graphical representation of the tree model.

Figure 4B:
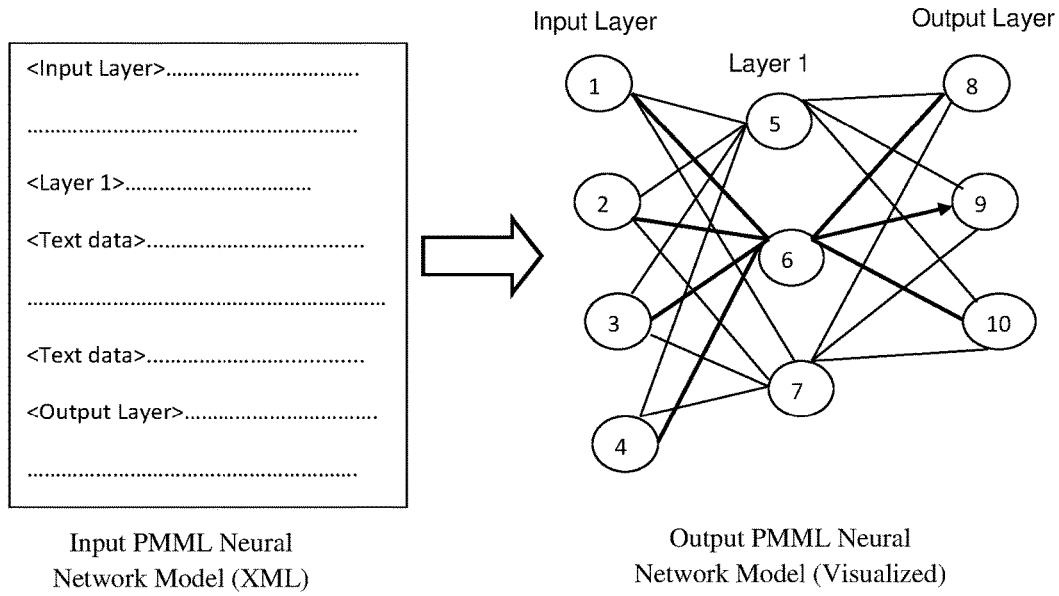

FIG. 4b illustrates examples of visualizing a neural network model. Initially, the system 102 may built a set of standard template based upon various components and rules corresponding to the neural network model. The components include various nodes of the neural network model including, but not limited to, input neural nodes, output neural nodes, and edges connecting the input neural nodes to the output neural nodes of the neural network model and alike. Further, the system 102 may receive an input file from the user, wherein the input file corresponds to the neural network model to be visualized over a Graphical User Interface (GUI). The input file may be a Predictive Model Markup Language (PMML) file corresponding to the neural network model. The system 102 may further identify the standard template, from a set of standard templates, corresponding to the neural network model. Further, the system 102 may visualize a graphical representation of the neural network model and set of elements corresponding to the neural network. The system 102 may enable the user to modify the graphical representation of the neural network model over the GUI. In one aspect, the system 102 may enable the user to modify relationship between input neurons and output neurons, data flow between the neural nodes of the neural network models, features of the neural network models and others. In one example, the system 102 may edit various neural nodes of the neural network model, the input neural nodes, the output neural nodes, the edges connecting the input neural nodes to the output neural nodes, of the neural network model. Further, the system 102 may update the input file based on the modification of one or more elements from the set of elements of the graphical representation of the neural network model.

Although implementations for methods and systems for visualizing and updating a data analytics model using Graphical User Interface (GUI) have been described in language specific to structural features and/or methods, it is to be understood that the appended claims are not necessarily limited to the specific features or methods described.

We claim:

1. A method for visualizing and updating a data analytics model using Graphical User Interface (GUI), the method comprising:
   receiving, by a processor, a Predictive Model Markup Language (PMML) file corresponding to a data analytics model represented over a Graphical User Interface (GUI);
   identifying, by the processor, a standard template, from a set of pre-stored standard templates, corresponding to the data analytics model;
   displaying, by the processor, a graphical representation corresponding to the data analytics model, wherein the graphical representation is generated by analyzing the PMML file based upon the standard template, and wherein the graphical representation comprises a set of elements corresponding to the data analytics model;
   modifying, by the processor, one or more elements from the set of elements of the graphical representation based upon one or more inputs received from a user in real time, wherein modification comprises at least one of: updating weights associated to the one or more elements, modifying interactions of one element with others, and modifying data flow between two elements; and
   updating, by the processor, the PMML file in real time based upon the modifications of the one or more elements of the graphical representation, wherein the PMML file is updated without retraining the data analytics model thereby visualizing and updating the data analytics model using the GUI.

2. The method of claim 1, wherein the data analytics model is at least one of a logistic regression model, a regression model, a cluster model, a tree model, a neural network model.

3. The method of claim 1, wherein the standard template is built based upon a set of predefined rules corresponding to each data analytics models.

4. The method of claim 1, wherein the standard template comprises at least one of a plurality of nodes of the data analytics model, left/right child node of a parent node, an edge connecting the parent node to the child node, and weight associated to each node of the data analytics model.

5. The method of claim 1, wherein the predefined functional blocks comprise at least one of ready to use nodes, code blocks, arrows, and data flow instruments.

6. The method of claim 1, wherein the set of elements are modified from a palette of predefined functional blocks.

7. A system for visualizing and updating a data analytics model using Graphical User Interface (GUI), the system comprising:
   a processor; and
   a memory coupled to the processor, wherein the processor is capable of executing a plurality of modules stored in the memory, and wherein the plurality of modules comprising:
      a data capturing module for receiving a Predictive Model Markup Language (PMML) file corresponding to a data analytics model represented over a Graphical User Interface (GUI);
      a template identification module for identifying a standard template, from a set of pre-stored standard templates, corresponding to the data analytics model;
      a visualization module for displaying a graphical representation corresponding to the data analytics model, wherein the graphical representation is generated by analyzing the PMML file based upon the standard template, and wherein the graphical representation comprises a set of elements corresponding to the data analytics model;
      an editing module for modifying one or more elements from the set of elements of the graphical representation based upon one or more inputs received from a user in real time, wherein modification comprises at least one of: updating weights associated to the one or more elements, modifying interactions of one element with others, and modifying data flow between two elements; and
      an updating module for updating the PMML file in real time based upon the modifications of the one or more elements of the graphical representation, wherein the PMML file is updated without retraining the data analytics model thereby visualizing and updating the data analytics model using the GUI.

8. The system of claim 7, wherein the data analytics model is at least one of a logistic regression model, a regression model, a cluster model, a tree model, a neural network model.

9. The system of claim 7, wherein the standard template is built based upon a set of predefined rules corresponding to each data analytics model.

10. The system of claim 7, wherein the standard template comprises at least one of a plurality of nodes of the data analytics model, left/right child node of a parent node, an edge connecting the parent node to the child node, and weight associated to each node of the data analytics model.

11. The system of claim 7, wherein the predefined functional blocks comprise at least one of ready to use nodes, code blocks, arrows, and data flow instruments.

12. The system of claim 7, wherein the set of elements are modified from a palette of predefined functional blocks.

13. A non-transitory computer readable medium embodying a program executable in a computing device for visualizing and updating a data analytics model using Graphical User Interface (GUI), the program comprising a program code:

a program code for receiving a Predictive Model Markup Language (PMML) file corresponding to a data analytics model represented over a Graphical User Interface (GUI);

a program code for identifying a standard template, from a set of pre-stored standard templates, corresponding to the data analytics model;

a program code for displaying a graphical representation corresponding to the data analytics model, wherein the graphical representation is generated by analyzing the PMML file based upon the standard template, and wherein the graphical representation comprises a set of elements corresponding to the data analytics model;

a program code for modifying one or more elements from the set of elements of the graphical representation based upon one or more inputs received from a user in real time, wherein modification comprises at least one of: updating weights associated to the one or more elements, modifying interactions of one element with others, and modifying data flow between two elements; and a program code for updating the PMML file in real time based upon the modifications of the one or more elements of the graphical representation, wherein the PMML file is updated without retraining the data analytics model thereby visualizing and updating the data analytics model using the GUI.

* * * * *